(12) United States Patent
Van Den Biggelaar

(10) Patent No.: US 7,446,854 B2
(45) Date of Patent: Nov. 4, 2008

(54) LITHOGRAPHIC APPARATUS AND DEVICE MANUFACTURING METHOD

(75) Inventor: Petrus Marinus Christianus Maria Van Den Biggelaar, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 450 days.

(21) Appl. No.: 11/348,518

(22) Filed: Feb. 7, 2006

(65) Prior Publication Data

US 2007/0182944 A1    Aug. 9, 2007

(51) Int. Cl.
*G03B 27/42* (2006.01)
(52) U.S. Cl. .............................. 355/53; 355/72; 355/77
(58) Field of Classification Search .................... 355/72, 355/77

See application file for complete search history.

(56) References Cited

U.S. PATENT DOCUMENTS

| | | | | |
|---|---|---|---|---|
| 5,663,783 | A | * | 9/1997 | Ueda ............................ 355/53 |
| 2005/0140326 | A1 | * | 6/2005 | Houkes et al. ............... 318/632 |
| 2006/0238739 | A1 | * | 10/2006 | Butler ........................... 355/72 |

* cited by examiner

*Primary Examiner*—Della J. Rutledge
(74) *Attorney, Agent, or Firm*—Sterne, Kessler, Goldstein & Fox P.L.L.C

(57) ABSTRACT

A lithographic apparatus includes a first control system to control a first physical quantity in the lithographic apparatus. A parameter in the first control system is dependent on a value of a further physical quantity in the lithographic apparatus. The parameter may be included in a feedforward path. An input of the feedforward path may be connected to a second control system, the second control system to control a second physical quantity in the lithographic apparatus. The feedforward path may provide a feedforward signal to the first control system in dependency on a signal in the second control system. The further physical quantity may include the second physical quantity.

32 Claims, 4 Drawing Sheets

LITHOGRAPHIC APPARATUS AND DEVICE MANUFACTURING METHOD

BACKGROUND

1. Field of the Invention

The present invention relates to a lithographic apparatus comprising a first control system to control a first physical quantity in the lithographic apparatus, and a device manufacturing a method comprising transferring a pattern from a patterning device onto a substrate.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, control systems are commonly used to control a variety of physical quantities, such as positions, speeds, accelerations, etc. of moving parts, dosages of irradiation, temperatures, gas flows, and many other physical quantities. Thereto, a plurality of control systems are known. It is known, for example, to make use of feedback control systems, feedforward control systems or combined feedback/feedforward control systems. A technique that has been applied in the past years is known under the name iterative learning control (ILC). In iterative learning control, use may be made of a table which is filled with a time series of values. The table may be triggered by an event, upon which the time series of values is provided as a signal, such as a feedforward signal. This process may be made iterative by monitoring the to be controlled value during and/or after the triggering of the table. From the to be controlled quantity, or from any other suitable quantity, such as an error signal, new values for the time series of the table, may now be determined. This process may be repeated a plurality of times, thereby read out to provide an iterative process in which the control system, by monitoring a behavior of the control system itself, or by monitoring a behavior of the output quantity, of the error signal or of any other suitable signal, iteratively determines a new time series for the table, thereby iteratively attempting to fill the table with a time series to provide an optimum response of the control system.

Despite the many benefits of present feedback and feedforward control systems, and the many benefits of iterative learning control, several problems come forward in the current control systems of lithographic apparatus. A first aspect of such problems is that iterative learning control may provide an adequate solution only for repeating, substantially identical situations. For example, in case that a disturbance shows a change as a function of any variable, thereby a different amount of correction by the control system may be required to cancel an effect of such a disturbance as good as possible. Iterative learning control will in such a situation show shortcomings, as the time series stored in the table will normally have been optimized taking a certain amount of disturbance in consideration. An attempt to cope with this situation making use of iterative learning control, is to provide a plurality of time series in a plurality of tables. Depending on a situation, a most suitable one of the tables may be chosen, thereby providing for a better cancellation of the effects of the disturbance, however at an expense of increased complexity. Furthermore, each of the tables requires an iterative process to determine appropriate time series, increasing set-up times, calibration times, etc. Above, even in the situation of a plurality of time series, an optimum cancellation of the effects of the disturbance may only be achieved for situation which match the circumstances under which the particular time series has been determined. Deviations, such as a change in the amount of disturbance due to any reason, will not be taken in account here. An example of the situation described here is a two-dimensional control of a stage (such as a wafer stage, reticle stage, etc.). The stage may commonly be provided with a plurality of control systems, each to control a positional quantity (e.g. a position, a velocity, acceleration, etc.) in a single dimension. In case that a movement in one direction is made, such movement may cause a disturbance on another one of the dimensions. The amount of disturbance (such as cross talk) may vary depending on a position of the stage, thereby making a use of iterative learning control inappropriate to provide e.g. a suitable feedforward signal to compensate for the disturbance.

SUMMARY

It is desirable to improve a control of a physical parameter in a lithographic apparatus.

According to an embodiment of the invention, there is provided a lithographic apparatus including a first control system to control a first physical quantity in the lithographic apparatus, a gain factor parameter in the first control system being dependent on a value of a further physical quantity in the lithographic apparatus.

In another embodiment of the invention, there is provided a device manufacturing method including transferring a pattern from a patterning device onto a substrate by a lithographic apparatus, the method including controlling by a first control system a first physical quantity in the lithographic apparatus, a gain factor parameter in the first control system being dependent on a value of a further physical quantity in the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
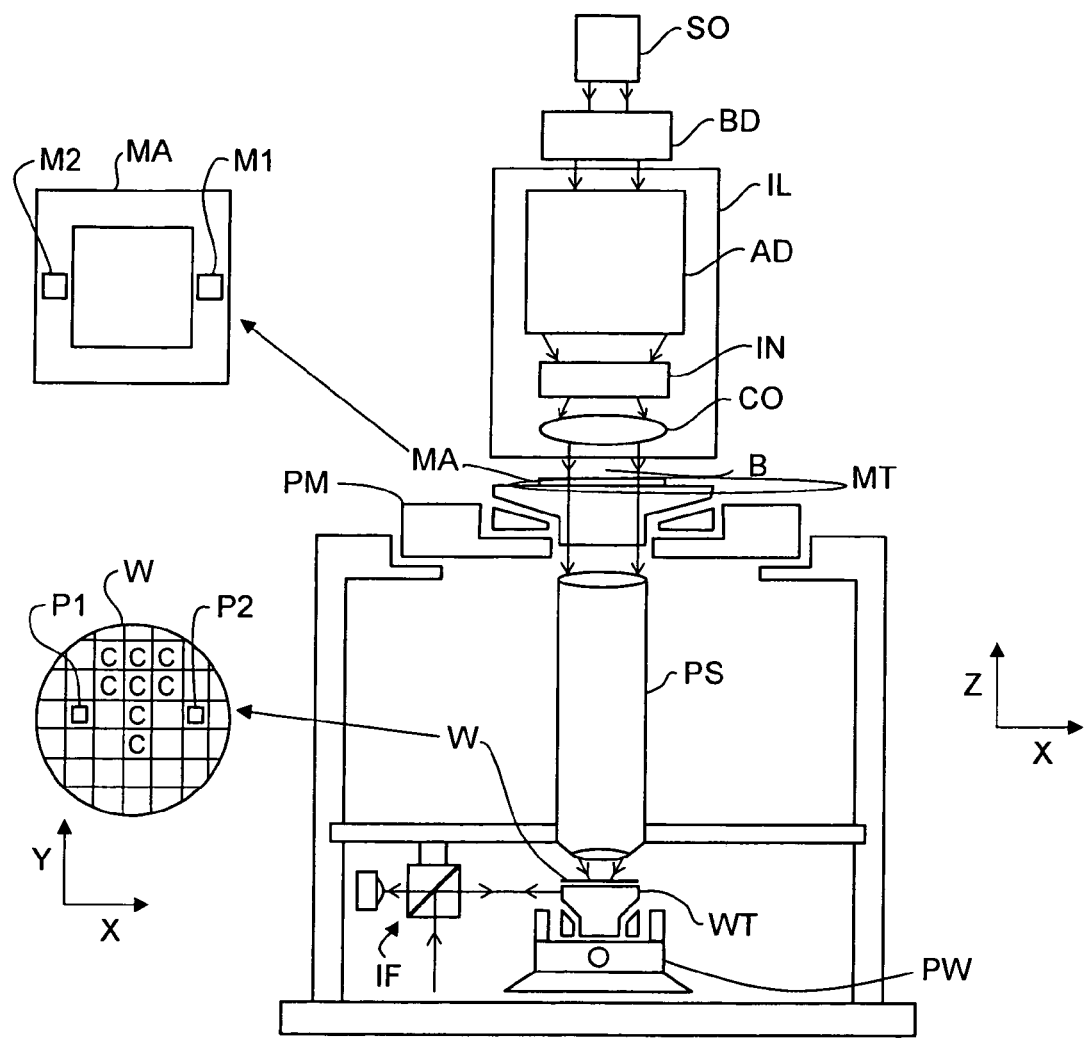
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g.

so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
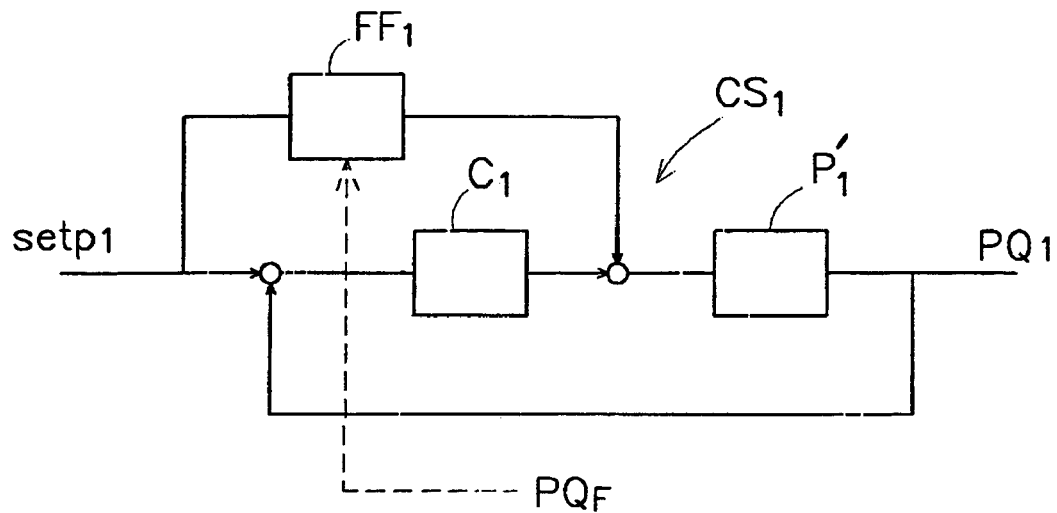
FIG. 2 depicts a block diagram of a control system according to an embodiment of the invention.

FIG. 2 shows a first system including a combined feedforward/feedback configuration. A process P'1 provides as an output thereof a physical quantity PQ1. A feedback loop is provided by a feedback path from PQ1 to an input of controller C1, an output of controller C1 being connected to an input of process P'1. A setpoint setp1 is provided to the input of controller C1 as well as to an input of feedforward FF1, an output of which is provided to the input of process P1. In fact, as can be seen from FIG. 2, the outputs of feedforward FF1 and controller C1 are added to provide the input for process P'1, while the feedback signal is subtracted from the setpoint setp1 to provide the input for the controller C1. FIG. 2 further depicts a further physical quantity PQF, a parameter in the first control system CS1 being dependent on a value of the further physical quantity PQF.

The first physical quantity and the further physical quantity may include any physical quantity, either such as a position, a velocity, an acceleration, a jerk, a snap, a crackle, a pop, etc., a temperature, a force, a pressure, an intensity of radiation, a special distribution of radiation, a wave length, or any other mechanical, thermodynamical, acoustical, optical, electrical, or electronic parameter. The first physical quantity and the further physical quantity may be of a same sort, thus e.g. both be a position, a velocity, an acceleration, a temperature etc. however it is equally well possible that these quantities relate to different sorts.

Also, although both the first physical quantity PQ1 and the further physical quantity PQF may relate to a physical quantity in the lithographic apparatus, they may relate to different structures thereof, or to a same structure thereof. Examples will be provided below. In this example, a parameter in the feedforward FF1 depends on a value of the further physical quantity. For example, a gain factor (such as an amplification factor) may be dependent on the value of the further physical quantity. Thereby, a characteristic of the control system CS1 may be made dependent on a value of the further physical quantity PQF. As an example, the further physical quantity PQF may represent a position of a stage (such as the substrate stage or the reticle stage) along the Y-axis while the first physical quantity PQ1 represents the position of the stage along the X-axis.

The control system CS1 thus controls the position of the stage along the X-axis. A characteristic of the control system may now be made dependent on the position of the stage along the Y-axis. This may be useful because characteristics of the stage and the actuators to drive the stage may be dependent on a position thereof. For example, the actuators may show non-linearities, atmospheric disturbances due to gas flows near the substrate or disturbances caused by immersion fluid may be different at different positions of the stage, or resonance frequencies from the stage may be visible with different amplitude at different positions of the stage. Next to the examples provided above, any other configuration may be applied to adapt a characteristic of the first control system CS1 to a value of the further physical quantity PQF. Instead of, or in addition to, the example provided in FIG. 2, the further physical quantity PQF may also have an effect on any other part of the first control system CS1, such as on the controller C1. It may thus be the case that a parameter in the first controller C1 is dependent on the value of the further physical quantity PQF, the parameter may for example be a gain factor, a filter characteristic (such as a filter band width, cut-off frequency etc.), thereby providing for a change in the feedback control in dependency on the further physical quantity PQF. Instead of, or in addition to, the example provided above, the first control system may include any control system, such as a feedback control system, a feedforward control system, a combined feedback-feedforward control system, an analogue control system, a numeric control system, etc. The parameter which is dependent on the value of the further physical quantity may include any parameter, such as a gain factor (amplification factor), a pole frequency, a zero frequency, a band width, any other filter characteristic, etc. Applications of the above principle may include a wafer/substrate positioning or reticle/patterning device positioning control system which is compensated for a deviation in a mass of the wafer, respectively Reticle, from a nominal mass, a variable gain to compensate for saturation effects in a motor, etc.

Figure 3:
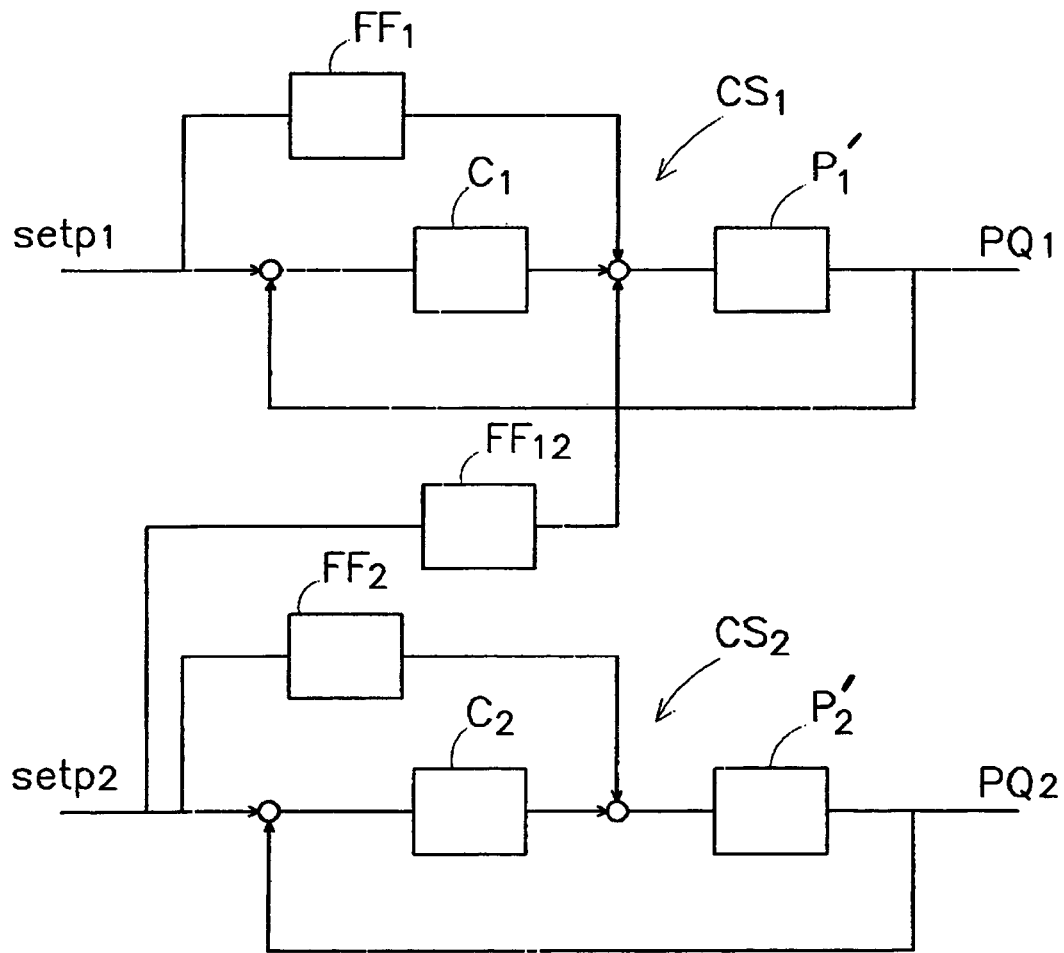
FIG. 3 depicts a block diagram of a feedforward according to an embodiment of the invention.

A further embodiment of the invention will now be described with reference to FIG. 3. FIG. 3 shows a first control system CS1 and a second control system CS2. The first control system CS1 to control a first physical quantity PQ1, the second control system CS2 to control a second physical quantity PQ2. The first control system includes a process P'1 which provides the first physical quantity PQ1, a controller C1 and a feedforward FF1. A configuration of the process P'1, controller C1 and feedforward FF1 may be identical to the set up as described with reference to process P'1, controller C1 and feedforward FF1 of control system CS1 in FIG. 2, and therefore a more detailed description thereof will be omitted here. The second control system CS2 likewise includes a second process P'2 providing the value of the second physical quantity PQ2, a controller C2 and a feedforward FF2. The second control system CS2 in this example also includes a combined feedforward/feedback control system, a feedforward part being provided by FF2, and a feedback part being provided by a close loop including C2, P2 and a feedback of the physical quantity PQ2 to an input of controller C2 while the feedforward path includes feedforward FF2 which provides a feedforward signal to an input of process P2. Furthermore, FIG. 3 shows feedforward FF12 which provides a feedforward signal from setpoint SETP2 to the first control system CS1 in this example to the input of process P'1.

An output of feedforward FF12 is thus, in this example, added to the output of controller C1 and feedforward FF1. Thereby, a cross feedforward may be provided, an effect of which will be described below. In general, an input of the feedforward path FF12 is in such a configuration connected to the second control system, the feedforward path FF12 thereby providing a feedforward signal to the first control system in dependency on a signal in the second control system. In the example depicted in FIG. 3, that signal in the second control system is the setpoint signal SETP2, however any other suitable signal may be applied, such as the physical quantity PQ2, an output of the feedforward FF2 etc. The output of the feedforward FF12 may be applied to the input of process P'1, as depicted in FIG. 3, however may be provided to the first control system CS1 at any other suitable location. It may, for example, be imaginable that the output of the feedforward FF12 is provided to the input of controller SC1, or any other suitable signal in the first controller system CS1.

To explain an effect of the feedforward FF12, an example thereof will be described first. Assume that first physical quantity PQ1 is a position of the substrate table in X direction, while the second physical quantity PQ2 is a position of the substrate table in Y direction. The first control system CS1 thus controls a position of the substrate table in X direction while the second control system CS2 controls a position of the substrate table in Y direction. Theoretically, an action of the first control system CS1 will have effect on the position of the substrate table in X direction only, while an action of the second control system CS2 will likewise have an effect on the position of the substrate table in Y direction only. The inventors have however devised that some degree of cross talk from Y to X, or from X to Y may be present. This may e.g. be due to imperfections in the actuators which drive the substrate stage imperfections in a drive mechanism or guiding mechanism to drive respectively guide the substrate table, imperfections in position sensors which measure a position of the substrate table in X direction respectively Y direction, or any other cause. Thus, when the second control system CS2 performs an action to position the substrate table in Y direction, a disturbance in X direction may be generated which is to be coped with by the first control system CS1 to take away an effect thereof as good as possible. The inventors have now devised that an accuracy of the first control system CS1 may be improved and thereby a positioning of the substrate table in (in this example X direction) may be improved, by providing the feedforward FF12, thus a feedforward which provides a feedforward signal to the first control system in dependency on a signal in the second control system. A transfer function of the feedforward FF12 may now be chosen such that an effect of the disturbance may be counteracted, i.e. compensated for. Thus, the feedback loop of the first control system CS1 may be released from the task of regulating away such a disturbance due to cross talk, thereby enhancing an accuracy of the positioning of the substrate table in X direction, thus an accuracy of the first physical quantity PQ1 as a sensitivity to an action in the second control loop CS2 (e.g. a positioning of the substrate table in Y direction, a movement acceleration, deceleration etc.) will now have a lower effect on the position in X direction due to a compensation or partly compensation of cross talk by the feedforward FF12.

Figure 5:
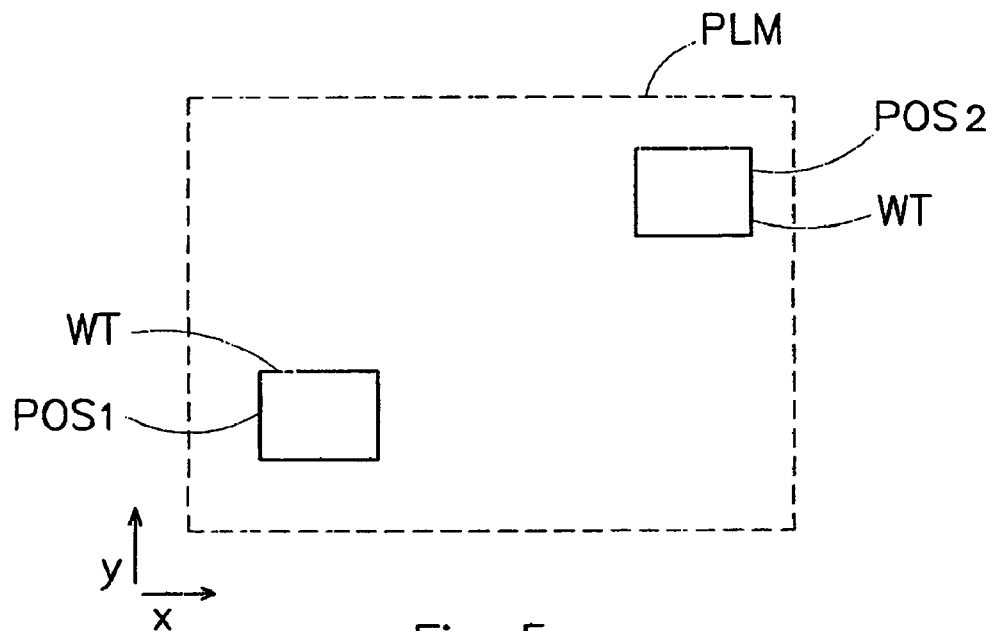
FIG. 5 depicts a stage whose position is controlled in multiple dimensions.

The inventors have in addition to the above devised that an amount of cross talk may be dependent on the values of the first, respectively, second physical quantities PQ1, PQ2. In the example described here, the cross talk may thus be dependent on the position of the substrate table in X direction and/or in Y direction. This may be the case because the causes which cause the cross talk, in general parasitic or unwanted effects, imperfections, etc. may differ depending on a position of the stage. An example is depicted in FIG. 5, where a top view of a plane of movement PLM of a substrate table is shown, thus representing a plane which is substantially parallel to a plane defined by the X and Y axis. At position POS1 of substrate table WT, cross talk from X to Y respectively from Y to X may differ from that at position POS2 of the substrate table WT. To take such a variation in cross talk into account, a parameter in the feedforward FF12 of FIG. 3 may be made dependent on the position of the substrate table WT in X direction and/or in Y direction. The parameter may e.g. be a gain factor parameter or any other parameter such as a filter band width, a put off frequency, a pole frequency, a zero frequency, etc.

The feedforward FF12 has now been described with reference to a single example where the first and second physical quantities represent an X and Y position of a stage, it will however be appreciated by the skilled person that this principle may be applied to any other situation too, thus in case of any other physical quantity, examples of which have been given above. The second physical quantity may thus include any of the physical quantities which have been mentioned with reference to the first physical quantity above.

In FIG. 2, it has been described that a value of a further physical quantity PQF may have an effect on a gain factor parameter or other parameter in the first control system. Applying the principle of FIG. 2 to the variation in a parameter in FF12 in FIG. 3, the further physical quantity may be understood as to include the second physical quantity, the first physical quantity or a combination of the first and second physical quantities.

Figure 4:
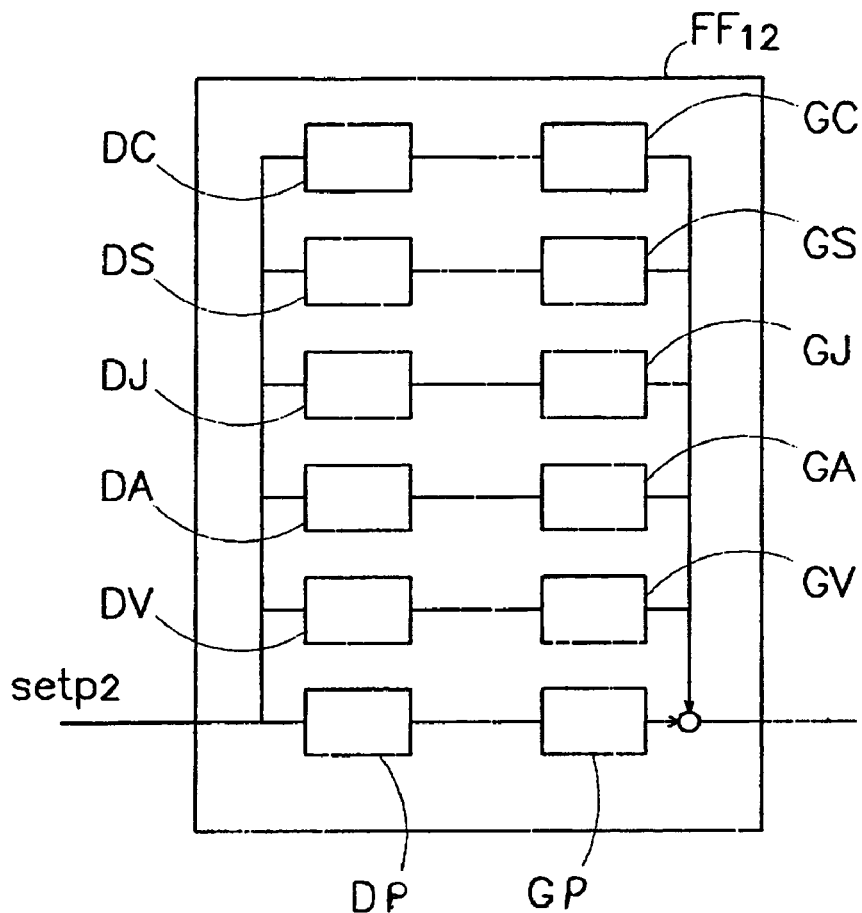
FIG. 4 depicts a detailed view of the feedforward path of FIG. 3.

FIG. 4 shows a detailed view of the feedforward FF12 showing an input connected to SETP2 in FIG. 3 and an output OUT which is in FIG. 3 connected to the summing points the feedforward output, the output of the first controller C1 and the output of the feedforward FF1. The feedforward FF12 includes a plurality of parallel paths, each including a delay and a gain. At the output OUT, outputs of each of the paths have been added. A first of the paths includes a position delay DP and a position gain GP. A second of the paths includes a velocity delay DV and a velocity gain GV. A third of the paths includes an acceleration delay DA and an acceleration gain GA. Likewise, further paths may include a jerk delay DJ and jerk gain GJ, snap delay DS and snap gain GS, crackle delay DC and crackle gain GC. In this example, the setpoint signal SETP2 may provide an acceleration setpoint. The position delay and position gain may thereby be understood as a position dependent delay and position dependent gain. Similarly, velocity delay and velocity gain may be understood as a velocity dependent delay and a velocity dependent gain.

As described above with reference to FIGS. 2 and 3, a parameter in the feedforward may be dependent on any physical quantity. In the feedforward shown here, such parameter may be incorporated in anyone of the delays and/or anyone of the amplification units providing the gains, thus GP, GV, GA, GJ etc. In the above, it has been described that the parameter may depend on a physical quantity, thus on a value of the physical quantity (the further physical quantity in FIG. 2, the first physical quantity, the second physical quantity or a combination of the first and second physical quantities in FIG. 3, etc.). Depending on a degree of influence of the physical quantity, a variety of dependencies may be selected. A simple implementation will result, for example, from a linear dependency i.e. the parameter linearly depending on the physical quantity. This may provide an adequate solution in case that the amount of feedforward, which may be required linearly, substantially linearly depends on the value of the appropriate physical quantity. A more versatile feedforward may be obtained by providing a parameter which quadratically depends on the further physical quantity. In the example shown in FIG. 2, parabolic or similar dependency curves may thereby be obtained, while in the embodiment shown in FIG. 3, a variety of curves for a dependency of the parameter on the physical quantity(s) may be obtained, including a parabolic shape, a saddleshape etc. as any dependency of the parameter of the first and/or second physical quantities may be obtained according to the formula:

$$\text{Parameter} = \alpha_1 \cdot PQ_1 + \alpha_2 \cdot PQ_2 + \alpha_3 \cdot PQ_1^2 + \alpha_4 \cdot PQ_2^2 + \alpha_5 \cdot PQ_1 \cdot PQ_2 + \alpha_6$$

where $\alpha_1$, $\alpha_2$, $\alpha_3$, $\alpha_4$, $\alpha_5$ and $\alpha_6$ represent constants to be chosen for obtaining a desired dependency of the parameter on $PQ_1$ and/or $PQ_2$.

Here, benefits with respect to iterative learning control as applied previously, become apparent. In case that a feedforward would be required, which is dependent on a value of one or more physical quantities that would require to have a time series table which is different for a plurality of values or ranges of the one or more physical quantities in question, thereby obtaining a plurality of time series tables, thus a plurality of tables which on the one hand would extremely complicate the control system, and on the other hand would require substantial time to be able to iteratively learn each time series for the values or value ranges of the physical quantity, respectively physical quantities in question.

Figure 6:
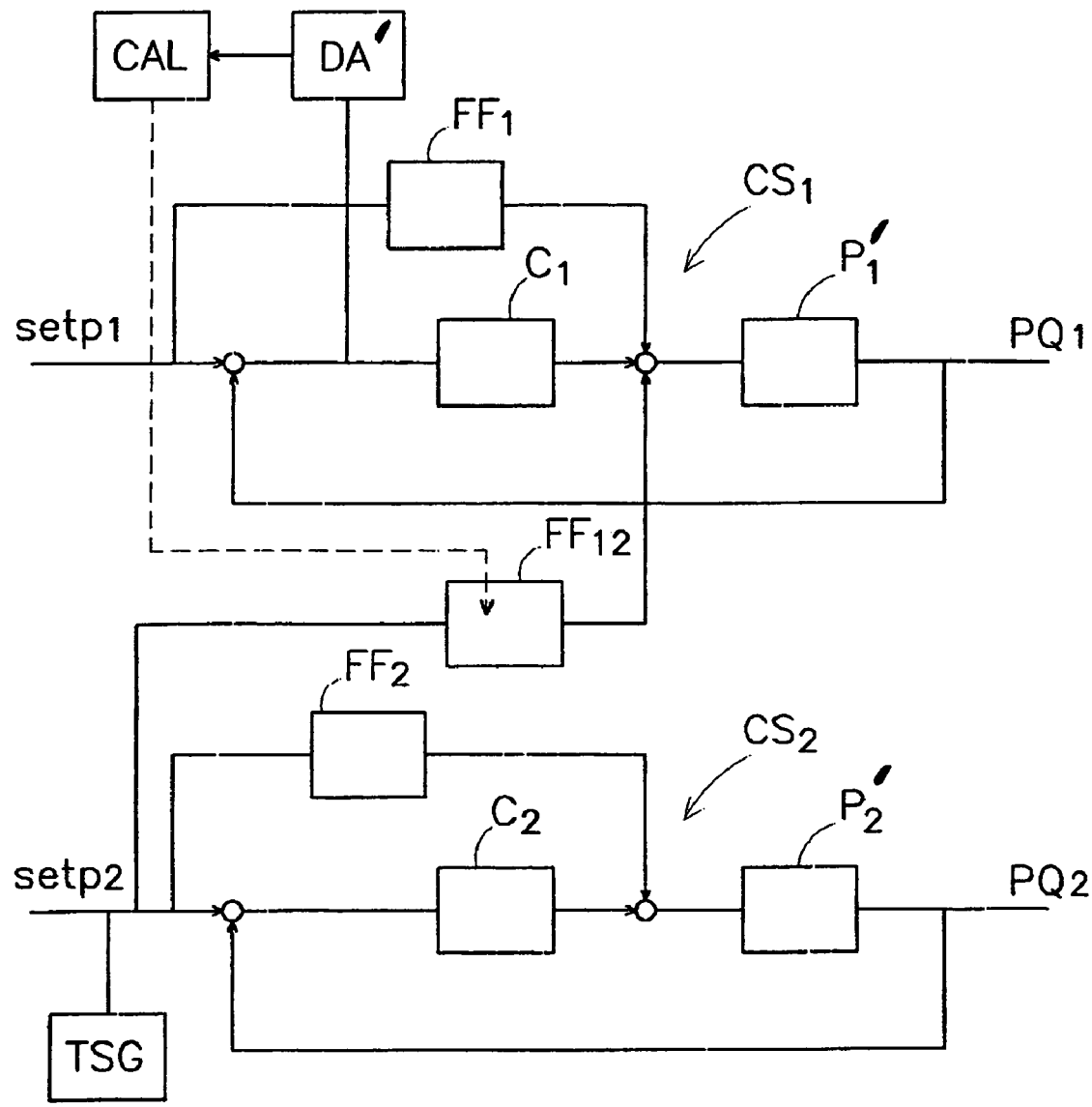
FIG. 6 depicts a block diagram of a control system for a lithographic apparatus according to a further embodiment of the invention.

A further embodiment of the invention will now be described with reference to FIG. 6. Here, a first control system CS1 and second control system CS2 are shown which are similar to or identical to the control systems depicted in and described with reference to FIG. 3. Also, the feedforward FF12 from the second to the first control system is depicted here. FIG. 6 further shows some additional elements which enable to determine a suitable transfer function of the feedforward FF12. These elements include a test signal generator TSG which is in this example connected to an input of the second control system CS2, in this example setpoint input SETP2. The test signal generator is able thereby to excite the second control system, thereby causing the second control system to perform a control action in response to such test signal as generated by the test signal generator. Further, a data acquisition DA' (also termed "data acquisition unit") is provided to detect a response to the test signal in the second control system. A suitable signal to detect by the data acquisition is the input signal as provided to the first controller C1, as this input signal represents a difference between the desired value of the physical quantity PQ1 (the desired value being provided by the first setpoint SETP1) and an actual value of the first physical quantity PQ1.

Having detected the response of the first control system in reply to an action in the second control system CS2 due to the test signal, a calculator CAL, as symbolically indicated in FIG. 6, may calculate a new transfer function of FF12, thus e.g. a new value for a parameter thereof. As a possible test signal of the test signal generator, an impulse signal may be provided, thus the test signal generator may include an impulse signal generator. In practice, use may be made of a generator providing a setpoint signal (such as a control system setpoint signal generator providing setp1 or setp2 in FIG. 3), as this causes derivatives of the setpoint signal to be limited in value thereof. Thus, by measuring a response to an excitation of one of the control systems, thus in general by measuring a response to an excitation causing a change in the second physical quantity, further physical quantity or other physical quantity which effect is to be compensated for, and detecting a response in the control system to be compensated on that excitation, a suitable transfer function for the feedforward to be applied to at least partly compensate for such disturbances by the physical quantity in question, may be determined. The test may be performed for a plurality of different values of the second physical quantity.

To obtain a transfer function of the feedforward in dependency on a value of the second physical quantity PQ2, the process described here of excitation, measuring and determining a transfer function may be performed for a plurality of values of the second physical quantity, or any other physical quantity of which a dependency on the amount of compensation by the feedforward is required (such as the further physical quantity according to FIG. 2, the first physical quantity according to FIG. 3, or combinations of the first and second physical quantities). Now having obtained a suitable transfer function for a plurality of values of the physical quantity respectively physical quantities in questions, a transfer function may be determined which is a function of that physical quantity respectively physical quantities, by any suitable curve fitting algorithm, etc.

According to a further embodiment of the invention, diagnostic information may be obtained from the transfer function thus obtained. This may be accomplished by, e.g., periodically determining the transfer function of the feedforward in question, and comparing that transfer function with a desired transfer function, or a desired range of the transfer function using a comparator (not shown). The comparator may be part of a diagnostic unit that is configured to diagnose/sense the lithographic apparatus. A diagnostic warning message may now be generated when the transfer function is outside a desired range of transfer functions. In a practical implementation, this may be implemented by comparing a value of the parameter in the transfer function, which depends on the physical quantity or physical quantities in question, with a desired range of the parameter, and generating a diagnostic warning message when the newly obtained value is outside the desired range. It is remarked that where above the term determining the transfer function or similar wordings have been used, this may also be interpreted as determining a value of the parameter which is depended on the physical quantity in question, or determine the parameter as a function of the physical quantity or physical quantities in question.

In FIG. 3 and FIG. 6, a configuration has been shown where a compensation by a disturbance from the second to the first control system, is implemented as a feedforward in the control system itself. An alternative solution may be provided in several applications. As an example, in case of a two a dimensional substrate positioning as explained with reference to FIGS. 3 and 5, combined actuators to drive the substrate table may have been provided. These combined actuators may be driven by a combined driving system having a driving matrix employed therein. In general, the matrix will have been programmed such that a drive of one of the control system to obtain a displacement in one direction will substantially result in a driving of an actuator corresponding to that direction. However due to imperfections in the driving, some degree of compensation therefore may have been provided in the matrix by having a small amount of drive to the other one of the actuators in the other direction. Mathematically, this may be described as follows:

$$\begin{bmatrix} Fx \\ Fy \end{bmatrix} = \begin{bmatrix} 1 & eps1 \\ eps2 & 1 \end{bmatrix} \begin{bmatrix} Cx \\ Cy \end{bmatrix} \quad \text{Matrix 1}$$

where Cx and Cy are the sum of controller outputs and feedforward for, respectively, the x and the y axes, Fx and Fy are forces generated by, respectively, x and y motors, eps1 is a small amount to compensate for imperfections that drive the stage in x direction when Cy in y direction is applied, eps2 is a small amount to compensate for imperfections that drive the stage in y direction when Cx in x direction is applied.

In this example, any compensation for cross talk may be incorporated in this matrix, e.g. by adding higher order terms, thereby e.g. obtaining a matrix having a transferfunction as depicted below.

$$\begin{bmatrix} Fx \\ Fy \end{bmatrix} = \begin{bmatrix} Hx(s) & Hxy(s) \\ Hyx(s) & Hy(s) \end{bmatrix} \begin{bmatrix} Cx \\ Cy \end{bmatrix} \quad \text{Matrix 2}$$

thereby thus enabling to incorporate the feedforward in an existing drive means.

According to a further embodiment of the invention, a compensation may be provided for a different amount of cross talk depending on a sign of (a change in) the disturbing physical quantity in question. As an example, referring to FIG. 3, if PQ2 shows an increase, then some amount of cross talk to PQ1 may be detected. A similarly large, however opposite change in PQ2, thus a change having a different sign, may result in a disturbance on PQ1 which may differ from being opposite to the disturbance detected on PQ1 previously.

Thus, depending on the sign of the change in PQ2, different amounts of compensation, thus different values of the transfer function of FF12 may be required to obtain an optimum compensation of the cross talk. As an example, in case of a two dimensional substrate stage control, where PQ1 and PQ2 represent positions of the substrate table in e.g. X and Y direction, a movement in Y direction may result in an amount of cross talk to the X direction, while an opposite change in the position in Y direction may result in a disturbance being unequal to an opposite of the disturbance detected previously. This effect may be obtained for changes in positions, changes in velocity, changes in acceleration, etc., hence the physical quantities may in this example be understood as including a position, speed, acceleration, etc. The inventors have now devised that a simple solution may be provided thereto by providing a transfer function of the feedforward FF12 which includes a dependency on the physical quantity in question as well as a dependency on a square of the physical quantity in question, thereby obtaining an amount of feedforward which is dependent on a sign of the physical quantity. As an example, in case that the physical quantity comprises an acceleration, a different transfer function in absolute terms of the transfer function may be obtained in case of equal, however opposite acceleration, thus accelerations having in absolute terms an equal magnitude, however having an opposite sign.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising a first control system to control a first physical quantity in the lithographic apparatus, a gain factor parameter in the first control system being dependent on a value of a further physical quantity in the lithographic apparatus.

2. The lithographic apparatus according to claim 1, wherein the first and the further physical quantity each comprise at least one of a position, a velocity, an acceleration, and a jerk.

3. The lithographic apparatus according to claim 1, wherein the gain factor parameter is comprised in a feedforward path.

4. The lithographic apparatus according to claim 3, wherein an input of the feedforward path is connected to a second control system, the second control system to control a second physical quantity of the lithographic apparatus, the feedforward path to provide a feedforward signal to the first control system in dependency on a signal in the second control system.

5. The lithographic apparatus according to claim 4, wherein the first and the second physical quantity each comprise at least one of a position, a velocity, an acceleration, and a jerk.

6. The lithographic apparatus according to claim 4, wherein the further physical quantity comprises the second physical quantity.

7. The lithographic apparatus according to claim 4, wherein the further physical quantity comprises the first and second physical quantities.

8. The lithographic apparatus according to claim 4, wherein the gain factor parameter comprises a gain factor in the feedforward path, the gain factor to determine at least one of a velocity gain, an acceleration gain, a jerk gain, a snap gain, a crackle gain, and a pop gain.

9. The lithographic apparatus according to claim 4, wherein the first and second physical quantities each comprise one of a dimensional position, a dimensional velocity and a dimensional acceleration, the dimension of the second physical quantity being substantially perpendicular to the dimension of the first physical quantity.

10. The lithographic apparatus according to claim 4, further comprising:
a test signal generator to excite the first control system,
a data acquisition unit to detect an error signal in the first control system due to a test signal by the test signal generator, and
a calculator to determine, using the error signal, a new value of the gain factor parameter.

11. The lithographic apparatus according to claim 10, wherein the test signal generator comprises one of an impulse signal generator and a control system setpoint signal generator.

12. The lithographic apparatus according to claim 10, further comprising a diagnostic unit to diagnose the lithographic apparatus, the diagnostic unit being provided with the new value of the gain factor parameter, the diagnostic unit comprising a comparator to compare the new value of the gain factor parameter with a desired range and to generate a diagnostic warning message when the new value is outside the desired range.

13. The lithographic apparatus according to claim 1, wherein the gain factor parameter linearly depends on the further physical quantity.

14. The lithographic apparatus according to claim 1, wherein the gain factor parameter quadratically depends on the further physical quantity.

15. The lithographic apparatus according to claim 1, wherein the gain factor parameter is comprised in a closed loop control path.

16. The lithographic apparatus according to claim 4, wherein the feedforward signal comprises a square of the signal in the second control system.

17. A device manufacturing method comprising:
transferring a pattern from a patterning device onto a substrate by a lithographic apparatus,
controlling with a first control system a first physical quantity in the lithographic apparatus, a gain factor parameter in the first control system being dependent on a value of a further physical quantity in the lithographic apparatus.

18. The method according to claim 17, wherein the first and the further quantity each comprise at least one of a position, a velocity, an acceleration, and a jerk.

19. The method according to claim 17, wherein the gain factor parameter is comprised in a feedforward path.

20. The method according to claim 19, wherein an input of the feedforward path is connected to a second control system, the second control system to control a second physical quantity of the lithographic apparatus, the feedforward path to provide a feedforward signal to the first control system in dependency on a signal in the second control system.

21. The method according to claim 20, wherein the first and the second physical quantity each comprise at least one of a position, a velocity, an acceleration, and a jerk.

22. The method according to claim 21, wherein the feedforward signal comprises a square of the signal in the second control system.

23. The method according to claim 21, further comprising:
exciting the first control system by a test signal,
detecting an error signal in the first control system due to the test signal, and
determining, using the error signal, a new value of the gain factor parameter.

24. The method according to claim 23, wherein the test signal comprises one of an impulse signal and a control system setpoint signal.

25. The method according to claim 23, further comprising diagnosing the lithographic apparatus using the new value of the gain factor parameter, the diagnosing comprising:
comparing the new value of the gain factor parameter with a desired range; and
generating a diagnostic warning message when the new value is outside the desired range.

26. The method according to claim 20, wherein the further physical quantity comprises the second physical quantity.

27. The method according to claim 20, wherein the further physical quantity comprises the first and second physical quantities.

28. The method according to claim 20, wherein the gain factor parameter comprises a gain factor in the feedforward path, the gain factor to determine at least one of a velocity gain, an acceleration gain, a jerk gain, a snap gain, a crackle gain, and a pop gain.

29. The method according to claim 20, wherein the first and second physical quantities each comprise one of a one dimensional position, a one dimensional velocity and a one dimensional acceleration, the dimension of the second physical quantity being substantially perpendicular to the dimension of the first physical quantity.

30. The method according to claim 17, wherein the gain factor parameter linearly depends on the further physical quantity.

31. The method according to claim 17, wherein the gain factor parameter quadratically depends on the further physical quantity.

32. The method according to claim 17, wherein the gain factor parameter is comprised in a closed loop control path.

* * * * *